(12) United States Patent
Hauser

(10) Patent No.: US 7,215,200 B1
(45) Date of Patent: May 8, 2007

(54) HIGH-LINEARITY DIFFERENTIAL AMPLIFIER WITH FLEXIBLE COMMON-MODE RANGE

(75) Inventor: Max Wolff Hauser, Mountain View, CA (US)

(73) Assignee: Linear Technology Corporation, Milpitas, CA (US)

( * ) Notice: Subject to any disclaimer, the term of this patent is extended or adjusted under 35 U.S.C. 154(b) by 132 days.

(21) Appl. No.: 11/116,427

(22) Filed: Apr. 28, 2005

(51) Int. Cl.
*H03F 3/45* (2006.01)

(52) U.S. Cl. ........................ 330/259; 330/258; 330/260

(58) Field of Classification Search ................ 330/259
See application file for complete search history.

(56) References Cited

U.S. PATENT DOCUMENTS

| | | | | |
|---|---|---|---|---|
| 3,727,757 A | * | 4/1973 | Boissicat | 209/573 |
| 4,725,790 A | * | 2/1988 | Addis et al. | 330/258 |
| 5,307,024 A | * | 4/1994 | Metz et al. | 330/259 |
| 6,011,440 A | | 1/2000 | Bell et al. | |
| 6,114,909 A | * | 9/2000 | Anzai et al. | 330/259 |
| 6,118,340 A | * | 9/2000 | Koen | 330/253 |
| 6,191,654 B1 | * | 2/2001 | Ikeuchi et al. | 330/252 |
| 6,265,929 B1 | | 7/2001 | Hauser | |
| 6,292,033 B1 | * | 9/2001 | Enriquez | 327/89 |
| 6,462,600 B2 | * | 10/2002 | Pakriswamy | 327/307 |
| 6,469,578 B1 | * | 10/2002 | Smith | 330/252 |
| 6,636,111 B1 | | 10/2003 | Gross et al. | |
| 6,704,560 B1 | * | 3/2004 | Balteanu et al. | 455/333 |
| 6,771,122 B2 | * | 8/2004 | Jin et al. | 330/69 |
| 6,873,703 B1 | * | 3/2005 | Enriquez | 379/399.01 |
| 7,113,016 B2 | * | 9/2006 | Hsieh et al. | 327/307 |
| 2005/0007195 A1 | | 1/2005 | Schrader | |

* cited by examiner

*Primary Examiner*—Benny Lee
*Assistant Examiner*—Krista Flanagan
(74) *Attorney, Agent, or Firm*—McDermott Will & Emery LLP

(57) ABSTRACT

An amplifier includes differential current sensing circuitry and an input bridge. Two paths of the input bridge receive the input signals and provide proportional current flows to the differential current sensing circuitry. The input bridge is configured to provide a differential offset voltage in one current path, and a complimentary voltage drop of equal magnitude in the other current path. In the examples, the input bridge includes a matched pair of transistors. To remove parallel incremental or small-signal conductance-related error sources, both transistors are operated at matched $V_{DS}$ (drain-to-source) voltages. The voltage offset, provided in association with one of the input transistors, serves to extend the range of certain circuits using the amplifier. The complimentary voltage drop in association with the other input transistor maintains the match of the $V_{DS}$ voltages for the two transistors.

17 Claims, 4 Drawing Sheets

HIGH-LINEARITY DIFFERENTIAL AMPLIFIER WITH FLEXIBLE COMMON-MODE RANGE

TECHNICAL FIELD

The present subject matter relates to techniques and circuits, typically for the input stage of a differential amplifier, for extending its input voltage range without disrupting linearity or common mode rejection.

BACKGROUND

Amplifier circuits are used in a variety of electronic systems for increasing the voltage, current, or power of a signal. A "differential" amplifier is a well-known type of amplifier circuit, which provides an output signal that is proportional to the difference between two input signals. An ideal differential amplifier is designed to amplify the difference between the two input signals while rejecting any signal element that is common to the two input signals.

Many types of electronic circuits, particularly for portable or mobile applications, use low operating voltages to increase battery life, reduce product weight, and enable use of denser integrated circuits. This is particularly advantageous in portable electronic devices. Lower voltages, however, may impose limits on circuit operation. For example, reducing circuit supply voltages also reduces the range of circuit signal voltages at which an amplifier or the like may operate.

The circuit of FIG. 8 is a differential input stage of an amplifier circuit. The purpose of the circuit is to sense a voltage difference $V_{ID}$ across its inputs, and to accurately reproduce that voltage across a resistor $R_1$. The resulting current flow in $R_1$ (which is $V_{ID}$ divided by $R_1$ by Ohm's Law) can be conveyed, through the metal oxide semiconductor (MOS) transistors $M_1$ and $M_2$, as an accurate signal in the form of a current, for further use in load 1 and/or load 2. The circuit uses two high DC gain type operational amplifiers $A_1$, $A_2$ and two transistors $M_1$, $M_2$, interconnected in negative feedback loops. Each operational amplifier is itself a differential amplifier for amplifying the difference between the signal input at the non-inverting input of the amplifier and the respective feedback signal at the inverting input.

A typical application may utilize the illustrated circuit as a transconductance amplifier serving as the input stage of voltage amplifier circuitry. The input stage elements provide proportional currents to additional circuitry, connected as the loads. In such an application, the additional circuitry represented by the loads provides gain and current conversion to an amplified voltage output node not shown. The amplifier input stage circuit shown in detail in FIG. 8, however, has limitations.

Referring now to FIG. 8 in more detail, consider initially an idle or equilibrium state where the input voltage difference, $V_{ID}$, is 0, because the two input voltages $V_{INP}$, $V_{INN}$ are identical. Each of the two operational amplifiers $A_1$, $A_2$ forms a local negative feedback loop with a transistor, $M_1$ or $M_2$, respectively. As long as the operational amplifiers have high DC gain, and all components are functioning normally, the negative feedback loops force the nodes $V_{SP}$, $V_{SN}$ to attain values equal to $V_{INP}$, $V_{INN}$, respectively. This is the "virtual-short-circuit" principle of operational amplifiers, that is to say, the feedback drives the inputs of an operational amplifier toward the same potential.

If $V_{INP}$, $V_{INN}$ differ in value by a nonzero value $V_{ID}$, the local feedback loops will continue, separately, to adjust to maintain each operational amplifier's inputs at the same potential. Consequently voltage $V_1$ across $R_1$ will tend to equal $V_{ID}$, if all components function as intended. The two constant current sources $I_1$ and $I_2$ (with identical values) deliver fixed currents, and the operational amplifiers have high input resistances (assumed infinite for ease of explanation). Therefore, any current that flows in $R_1$ must flow also through the transistors $M_1$, $M_2$ and appear as a difference in the drain currents of those transistors. This current will flow to subsequent circuitry (drawn abstractly as "loads") connected to the drains of the transistors $M_1$, $M_2$.

A limitation of the circuit of FIG. 8 becomes apparent when the input voltages $V_{INP}$, $V_{INN}$ approach the level of the negative power-supply voltage $V^-$. Upon this condition, the negative feedback loops around operational amplifiers $A_1$ and $A_2$ tend to force $V_{SP}$, $V_{SN}$ toward the negative supply voltage $V^-$. However, each of the transistors $M_1$ and $M_2$ needs at least some minimum voltage from its source to its drain, to function normally. Also, an added voltage drop of the load circuitry appears at the drain terminals of the transistors $M_1$, $M_2$, further reducing the available voltage range for the source-to-drain voltages of the transistors. Transistors require some nonzero voltage between gate and source ($V_{GS}$), a further constraint on the useful negative range of $V_{SP}$, $V_{SN}$, even if the outputs of the operational amplifiers can swing to the negative supply voltage. These factors limit the practical input voltage range at $V_{INP}$, $V_{INN}$ to some value more positive than $V^-$. This can be a relatively severe operational constraint in many applications, particularly those using relatively low magnitude power supply voltages.

A need exists for an effective technique to extend the operational range of the input voltage of a differential amplifier stage, e.g. for use as a transconductance input stage of an amplifier circuit.

The inventor has considered solutions to this constraint, that have proved insufficient. For example, the inventor has considered extending the input range of the circuit of FIG. 8 to the negative supply voltage by shifting $V_{INP}$ and $V_{INN}$ together. FIG. 3 shows a conceptual version of this approach, using identical level-shifting fixed voltage sources of value $V_{SHIFT}$. These voltage sources have other possible placements, but FIG. 3 is illustrative. The voltage sources $V_{SHIFT}$ in FIG. 3 are symbolic of the offset voltage function performed, and do not represent physical components. Examples of possible circuit components are discussed, later, with regard to FIGS. 5 to 7.

The feedback loops as before force the voltages on opposite ends of the resistor $R_1$ to values corresponding to voltages at the inputs of the operational amplifiers $A_1$, $A_2$. However, these voltages now include the offset voltage $V_{SHIFT}$. The offset can be chosen to provide necessary operational ranges across the respective transistors, even when the input signals approach the level of the negative supply voltage. Problems arise, however, with the considered circuit of FIG. 3, due to finite transistor output resistances associated with MOS transistors.

FIG. 4(a) represents an MOS transistor as may be used as an input transistor within operational amplifier $A_1$ or $A_2$, or for the transistors $M_1$, $M_2$. The drain current of any MOS transistor depends partly on its drain-to-source voltage $V_{DS}$, even when the transistor is biased for high output impedance (with a "saturated" or "pinched-off" channel), as is usual in amplifier circuits. This dependence can be modeled equivalently as an ideal transistor plus a parallel incremental or small-signal conductance, labeled $r_o$ in the illustration of FIG. 4(b) (this is a standard analytical technique).

The exemplary circuit shown in FIG. 5 implements the hypothetical technique outlined above relative to FIG. 3, using P-channel MOS transistors $M_{11}$, $M_{12}$ as "source followers" to provide the voltage offsets. The transistors $M_{11}$, $M_{12}$ have isolated "well" or back-gate connections tied to their sources, which eliminates a complication otherwise referred to as the "body effect." In principle, $M_{11}$ and $M_{12}$ exhibit constant voltage $V_{GS}$ between gate and source because of constant drain currents, regardless of the voltage swing at the gates. This accomplishes a common voltage shift of the positive (+) input $V_{INP}$ and the negative (−) input $V_{INN}$, as shown at $V_{SHIFT}$ in FIG. 3.

However, a problem tends to arise within this hypothetical technique. As $V_{ID}$ swings, $M_{11}$ and $M_{12}$ experience varying drain-to-source voltage $V_{DS}$. This $V_{DS}$ variation, through $r_o$, changes the $V_{GS}$ voltage that is required to pass the current from each constant-current source. This effect appears as a DC gain error from $V_{ID}$ to $V_1$, and it introduces nonlinearity in the signal path because the $r_o$ effect is not a true linear resistance. These can be dominant error sources for voltage amplification implementing the circuit described.

Transistors $M_1$ and $M_2$ also exhibit a finite $r_o$, but there the finite $r_o$ affects the signal path much less than with $M_{11}$ and $M_{12}$. Finite $r_o$ in the $M_1$, $M_2$ transistors changes the value of gate-to-source voltage $V_{GS}$ needed to induce the drain current in each transistor, but the gate-to-source voltage $V_{GS}$ of each transistor $M_1$ or $M_2$ is driven by a high-gain operational amplifier $A_1$ or $A_2$. The operational amplifier "absorbs" any $V_{GS}$ error at $M_1$ or $M_2$ by shifting its output voltage. The equivalent change at inputs $V_{INP}$ and $V_{INN}$ consists of this output shift divided by the large voltage gain of the operational amplifiers. In contrast, the transistors $M_{11}$, $M_{12}$ in the circuit of FIG. 5 have gate-to-source voltage drops $V_{GS}$, which are added directly to the input voltages. Errors from finite $r_o$ in MOS transistors $M_{11}$, $M_{12}$ add to the input signal voltage $V_{ID}$, and these gate-to-source voltage drops are not reduced by any amplifier gain.

Another hypothetical approach to building a circuit to implement the voltage offset strategy of FIG. 3 considered by the inventor, is to build the level-shift voltages into the operational amplifiers themselves. This approach exhibits problems similar to those found in the circuit of FIG. 5.

Consider now two practical approaches to build operational amplifiers with such hypothetical level shifting (that is, with large deliberate input offset voltage) built into input circuitry of the op-amps. The first approach introduces a voltage drop in series with the $V_{GS}$ path of one of the input transistors, within the operational amplifier itself. The other approach induces a mismatch between the input transistors, within the operational amplifier. FIG. 6 illustrates a voltage drop $V_{BIAS}$ in series with the $V_{GS}$ path of one of the input transistors of the operational amplifier, and FIG. 7 depicts a mismatch of input transistors within the operational amplifier. Both these techniques, however, tried to introduce errors that are dependent on the $r_o$ impedance characteristic of one or more of the transistors within the operational amplifier.

Considering now FIG. 6 in more detail, depicted is an example of an operational amplifier circuit, such as might be used as the amplifier $A_1$. A current-carrying diode $D_1$ interposes a voltage difference or drop between the source terminals of two input transistors $M_{13}$, $M_{14}$ of the operational amplifier. Note also components $R_{19}$, $R_{20}$, $Q_{15}$, $Q_{16}$ which are typical in such an operational amplifier; these components of the amplifier sense the current difference between the currents flowing from $M_{13}$ and $M_{14}$, while maintaining the drain terminals of $M_{13}$ and $M_{14}$ at similar potentials.

The circuitry of FIG. 6 can be used to produce an operational amplifier that will exhibit a voltage difference between its two inputs when a negative feedback loop is closed around it with high gain (a feedback path is omitted from this drawing). This voltage difference ideally equals the voltage drop across diode $D_1$ when conducting. The operational amplifier in FIG. 6 corresponds to one of the operational amplifiers, together with its input shift-voltage source, shown in FIG. 3.

However, the amplifier of FIG. 6 operates input transistor devices $M_{13}$, $M_{14}$ at different $V_{DS}$ voltages, because the drains are at the same potential but the sources are not. As the two input voltages of the operational amplifier move in common, even with a fixed difference between them (for example, under excursions of $V_{ID}$ in FIG. 3), the $V_{DS}$ voltages of $M_{13}$ and $M_{14}$ will vary. These variations alter the $V_{GS}$ voltage of each transistor, as in the circuit of FIG. 5, and the effect is not linear. Similar to the circuit of FIG. 5, this causes error in the path from $V_{ID}$ to $V_1$, which is undesirable.

FIG. 7 shows a fragment of another operational amplifier, in which the input transistors $M_{21}$, $M_{22}$ are deliberately mismatched to create an input offset without adding a diode or other explicit voltage drop. The mismatch may, for example, use a difference in MOS width/length dimensions, or different threshold-implant doping, or different transistor types, such as mixing bipolar and MOS transistors. All of these hypothetical methods, however, lead to different $r_o$ characteristics in $M_{21}$ and $M_{22}$. The magnitude, or the $V_{DS}$ dependence of both MOS transistors $M_2$, and $M_{22}$, of the $r_o$ effects in the two transistors, will differ. This leads again to errors as the two input terminals move in unison and therefore $M_{21}$, $M_{22}$ experience varying $V_{DS}$ voltages.

As shown by the preceding discussion, simple voltage shift techniques for providing a shift on one input of each operational amplifier, considered by the inventor, may help somewhat to extend the range of the transconductance stage. However, such techniques introduce undesirable non-linear performance, and may also disadvantageously reduce common mode rejection. Hence, a need still exists for a technique to extend the operational range of the input voltage of a differential amplifier or stage, while avoiding problems such as noted above.

SUMMARY

The teachings herein address the above noted problems with differential amplification by implementing an input bridge, coupled to the differential current sensory circuitry of the amplifier, and producing currents proportional to respective input signals to the sensory circuitry. In examples discussed in detail later, an input bridge of a differential amplifier includes a matched pair of transistors; and to remove the $r_o$-related error sources, both transistors are operated at matched $V_{DS}$(drain-to-source) voltages. A voltage offset is provided in association with one of the input transistors. A voltage drop of substantially the same magnitude as the offset voltage is provided in association with the other input transistor so as to maintain the match of the $V_{DS}$ voltages for the two transistors.

Hence, an amplifier for providing an output proportional to the difference between two input signals might include differential current sensing circuitry and an input bridge. Two paths of the input bridge receive the input signals and provide proportional current flows to the differential current sensing circuitry. The input bridge is configured to provide a differential offset voltage in one of the current paths and a complimentary voltage drop of equal magnitude in the other current path.

In the examples, the first current path of the input bridge comprises a first input transistor for receiving the first input signal, and a first circuit element coupled to the first input transistor so as to provide the differential offset voltage of the desired offset magnitude. The second current path comprises a second input transistor, matching the first input transistor, for receiving the second input signal. The second path further includes a second circuit element coupled to the second input transistor so as to provide a voltage drop of substantially the same magnitude as the differential offset.

In the two current paths, the matched transistors and the circuit elements are stacked in a complimentary fashion. In one path, the circuit element connects to a current supply, and the transistor connects to the current sensing circuitry. In the other path, the transistor connects to the current supply and the circuit element connects to the current sensing circuitry.

A variety of different matching circuit elements may be used to provide the offset voltage and the complimentary voltage drop, in the paths of the input bridge. Disclosed examples include matching diodes, matching diode connected transistors and matching resistors. However, in such examples, the transistors match; and the magnitude of the voltages across the circuit elements in the two paths are 'equal' (substantially the same). Although other transistors may be used, the examples of the bridge utilize metal oxide semiconductor (MOS) transistors. Each MOS transistor may have an isolated well or back-gate connection tied to its source.

The difference or differential amplifier may be utilized as one element of a circuit. The differential amplifier in such a circuit receives an input signal and a feedback signal on its inputs. A transistor coupled to the output of the differential amplifier produces a flow of current proportional to the output of the differential amplifier. The feedback signal is related to the flow of current produced by the transistor. Of course, this circuit itself may be utilized as a component of a larger circuit. For example, the input stage of a voltage-to-voltage amplifier might utilize a pair of such amplifier circuits.

Teachings discussed herein also encompass an improvement in a difference or differential amplifier. This improvement comprises first and second matched input transistors for receiving two input signals. The improvement also includes first and second matched circuit elements for providing equal magnitude voltage drops. The first element is coupled to the first input transistor, so as to provide current from a supply to the first input transistor. In this way, the first element provides a differential offset voltage of the desired magnitude. The first input transistor supplies a current proportional to the first input signal to further circuitry of the amplifier. The second input transistor is coupled to the supply, and the second circuit element is coupled to an output of the second input transistor so as to provide current proportional to the second input signal to the further circuitry of the amplifier. This second element also provides a voltage drop matching the differential offset voltage.

Teachings discussed herein also encompass a method of processing signals. The method involves producing a first current flow in a first path proportional to the first input signal and producing a second current flow in a second path proportional to the second input signal. A differential voltage offset is provided in the first path, and a complimentary voltage drop is provided in the second path. The magnitude of the complimentary voltage drop is equal to (substantially the same as) the magnitude of the differential voltage offset in the first path. A difference is sensed between the first and second proportional currents, e.g. to provide difference amplification.

Additional objects, advantages and novel features will be set forth in part in the description which follows, and in part will become apparent to those skilled in the art upon examination of the following and the accompanying drawings or may be learned by production or operation of the examples. The objects and advantages of the present teachings may be realized and attained by practice or use of the methodologies, instrumentalities and combinations particularly pointed out in the appended claims.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and circuitry have been described at a relatively high-level, without detail, in order to avoid unnecessarily obscuring aspects of the present teachings.

In the following example, removal of the $r_o$-related error sources requires operation of a matched pair of input transistors at matched $V_{DS}$(drain-to-source) voltages, in which input transistors are configured in circuit to form part of a bridge. Other elements of the bridge provide a desired voltage offset in one path and a complimentary voltage drop of substantially the same magnitude in the other path.

Figure 1:
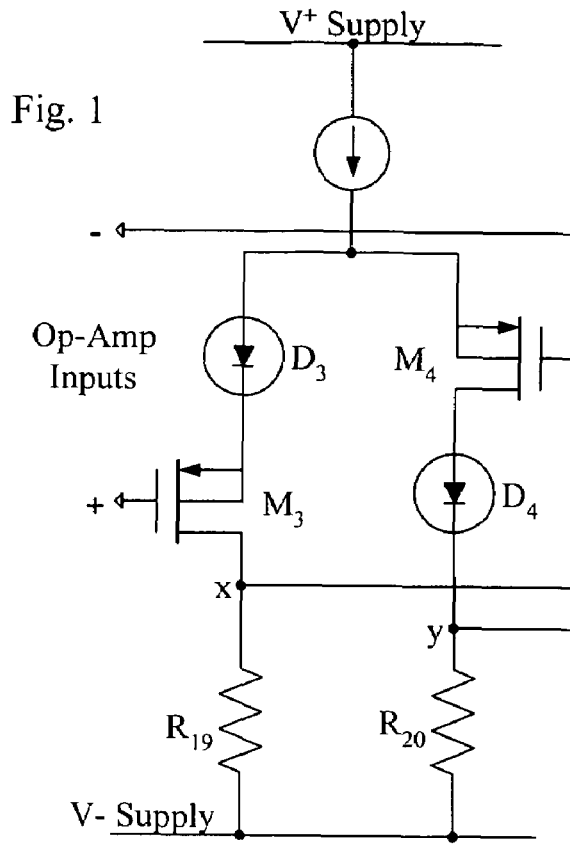
FIG. 1 illustrates a bridge circuit for an operational amplifier, providing a voltage offset and an equal magnitude complimentary voltage drop, in current paths of an input bridge that are responsive to the input signals to the operational amplifier.
Figure 7:
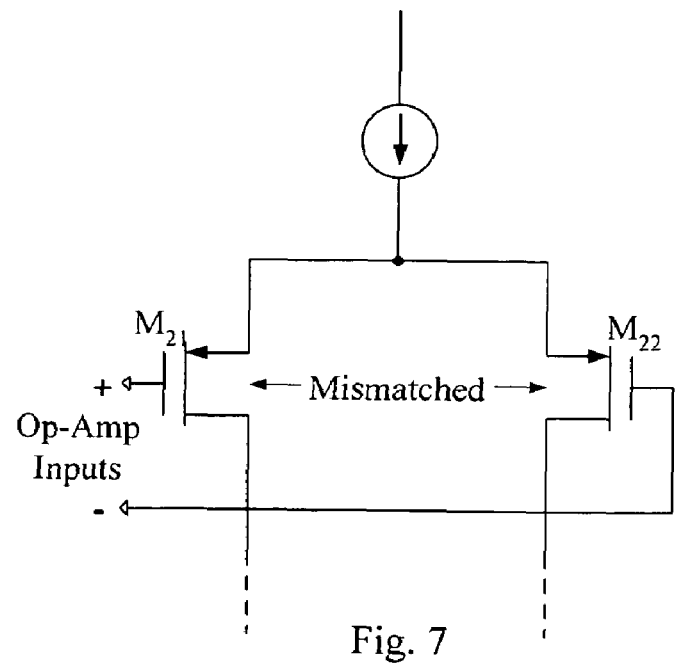
FIG. 7 illustrates an input circuit of a hypothetical operational amplifier, wherein input transistors of the circuit are mismatched, so as to provide one of the voltage offsets.
Figure 6:
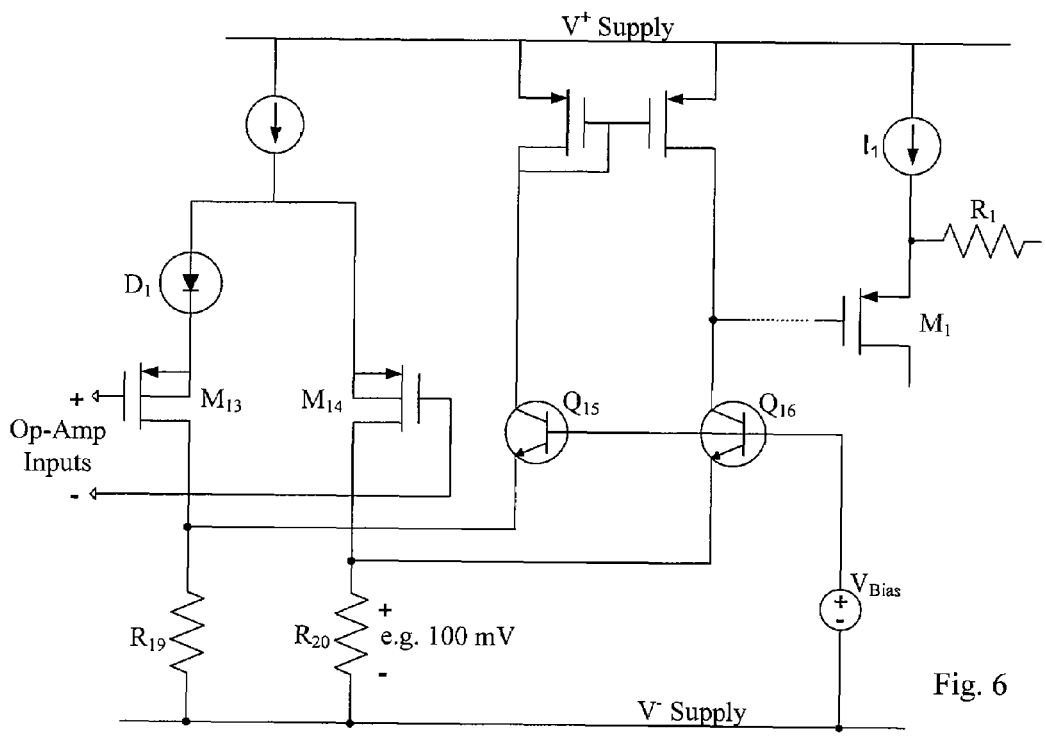
FIG. 6 illustrates a hypothetical operational amplifier having a voltage drop associated with one of the input transistors, so as to provide voltage offset.

FIG. 1 illustrates an example of the input circuitry of an operational amplifier which avoids problems of non-linearity or the like explained with reference to FIG. 6, caused by differences of the $r_o$ effects in the two input transistors. MOS transistors $M_3$, $M_4$ are input transistors of an operational amplifier, the drain-source path of each being stacked with a diode. These diodes are matched, so that when conducting, the voltage across them is substantially the same. The two paths are connected at the top, but the order of transistor and diode in each path is mutually reversed. As discussed more below, one of the diodes provides an offset voltage drop in relation to the input signal, whereas the other diode provides a complimentary voltage drop. The bottoms of the stacks (nodes x, y) connect to further circuitry of the amplifier that senses the current difference between the two stacks.

Considering the example of FIG. 1 now in more detail, a current source connected to the positive voltage rail supplies constant current to the top of the bridge. On one side of the bridge, a first diode $D_3$ is connected between the constant current source and the source of the first transistor $M_3$ of the matched MOS input transistors $M_3$, $M_4$. When conducting, diode $D_3$ produces a constant voltage drop, and thus a voltage offset (from that at the current source) in the first path of the bridge through transistor $M_3$. The drain of the first MOS input transistor $M_3$ is connected to node x, and from there through a resistor $R_{19}$ to the negative voltage supply rail. The gate of the MOS input transistor $M_3$ serves as the positive (+) input of the operational amplifier.

On the other side of, or path through, the input bridge, the source of matched MOS input transistor $M_4$ receives current flowing from the constant current supply. The voltage at this point (source of $M_3$) is the voltage as it appears at the output of the constant current source, that is without voltage offset. The drain of the MOS input transistor $M_4$, however, is connected to a second diode $D_4$, that when conducting, produces a constant voltage drop of substantially the same magnitude as that across the diode $D_3$. The diode $D_4$ is connected to node y, and through a resistor $R_{20}$ to the negative voltage supply rail. The gate of the second MOS input transistor $M_4$ serves as the negative (−) input of the operational amplifier.

Those skilled in the art will understand that the transistor and diode types, the connections, and the resulting polarities are exemplary only.

The nodes x and y provide connections of the input bridge circuit to other elements of the respective operational difference amplifier. In FIG. 6, the further circuitry is shown as comprising $R_{19}$, $R_{20}$, $Q_{15}$, $Q_{16}$ for current sensing and current to voltage conversion, although other operational amplifiers may utilize different elements for that circuitry.

Under high-gain negative feedback of the operational amplifier, this arrangement will tend to force the two stacks to carry identical currents, and also will maintain nodes x and y at substantially the same potential (another case of "virtual short circuit"). Because each stack or path has the same potential at top and bottom, the sums of voltages within each stack must be equal. As long as the diode voltage drops are equal, the drain-to-source voltages $V_{DS}$ of the two transistors $M_3$, $M_4$ will therefore be equal.

In this way, the "bridge" or "diamond" configuration of diodes and input transistors of FIG. 1 maintains the same drain-to-source voltage $V_{DS}$ on both MOS input transistors $M_3$ and $M_4$. However, the complimentary placement of the diodes $D_3$ and $D_4$ imposes an offset voltage between the two op-amp inputs when they are in a negative feedback loop. This offset voltage is set by the voltage drop of diode $D_3$ (interposed between the two input-transistor $V_{GS}$ paths).

Figure 3:
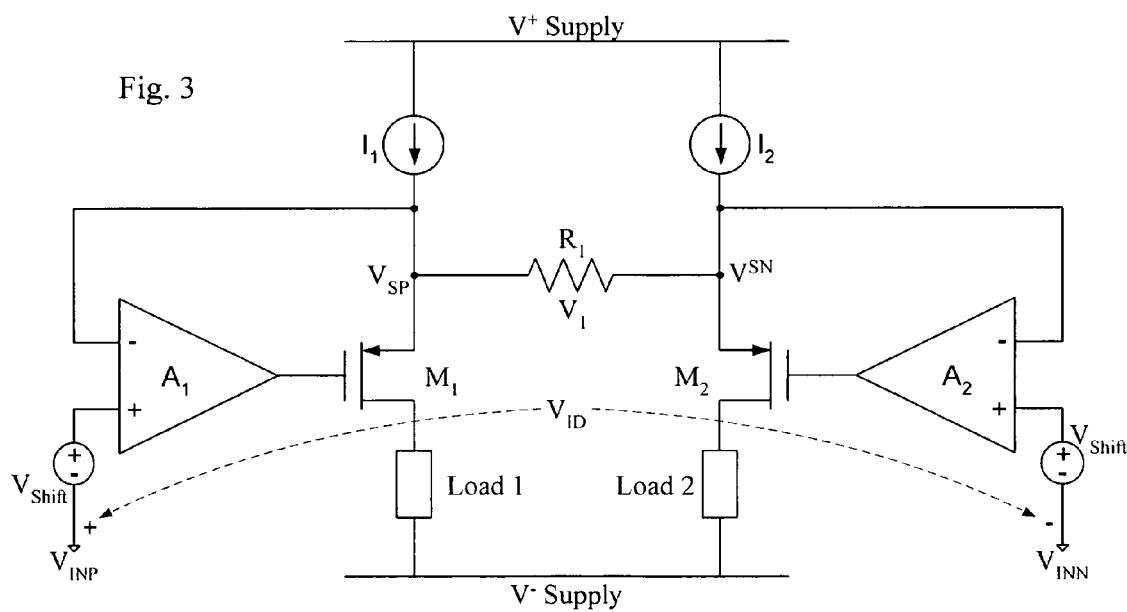
FIG. 3 is a diagram of a differential input stage of an amplifier circuit, with hypothetical external voltage offsets on the inputs to increase operational voltage range.
Figure 4A:
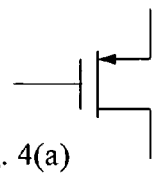
FIG. 4(a) illustrates an MOS transistor.
Figure 4B:
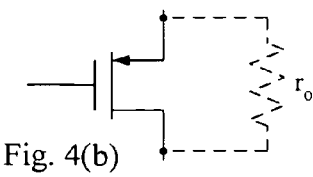
FIG. 4(b) illustrates a model of the transistor as a combination of an ideal transistor and a parallel output impedance.
Figure 5:
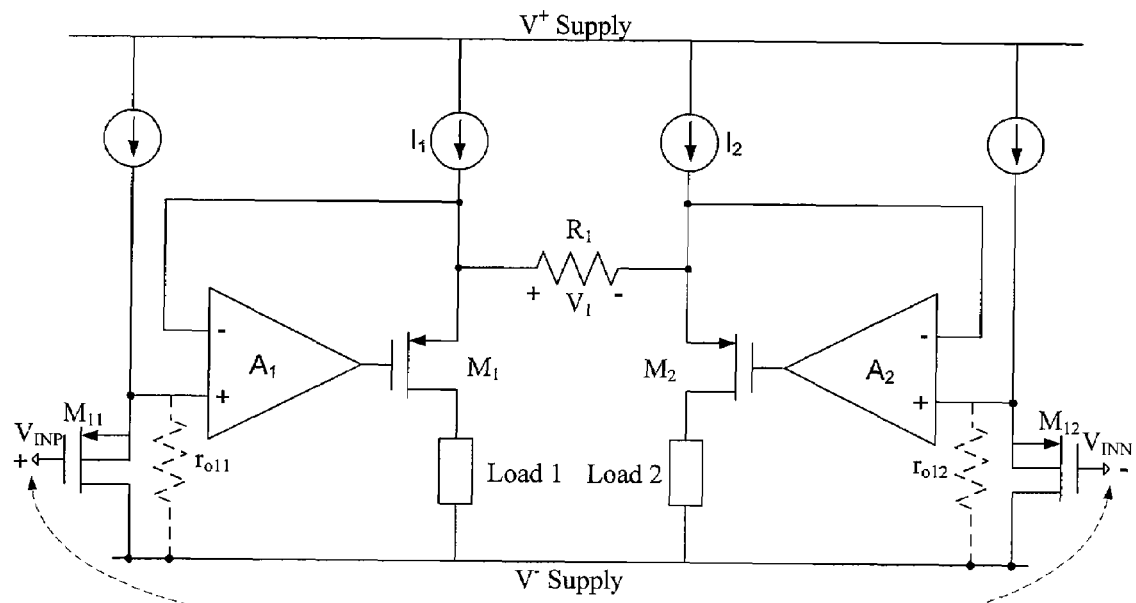
FIG. 5 illustrates a hypothetical differential input stage of an amplifier circuit, which uses a transistors configured as source followers to provide voltage offset for each input signal.

Stated another way, the voltage at the source of the transistor $M_3$ is offset lower than the voltage at the source of the transistor $M_4$ by the magnitude of the voltage appearing across conducting diode $D_3$. This voltage offset serves as an input voltage shift, analogous to that discussed above relative to FIGS. 3 and 6. Because of the position of the diode $D_4$, however, the voltage across that second diode does not affect differential processing by the input transistors $M_3$, $M_4$. Instead, that voltage drop compliments the voltage offset by diode $D_3$ so as to maintain matching of the drain-to-source voltages $V_{DS}$ across the two transistors $M_3$, $M_4$.

Various numbers and types of diodes may be used, to provide the desired magnitude for the voltage offset and the complimentary voltage drop. Also, the diodes may be replaced by any other suitable sources of predictable voltage drops. Examples of other suitable elements include diode connected transistors and resistors with a fixed value and predictable current flow.

Figure 2:
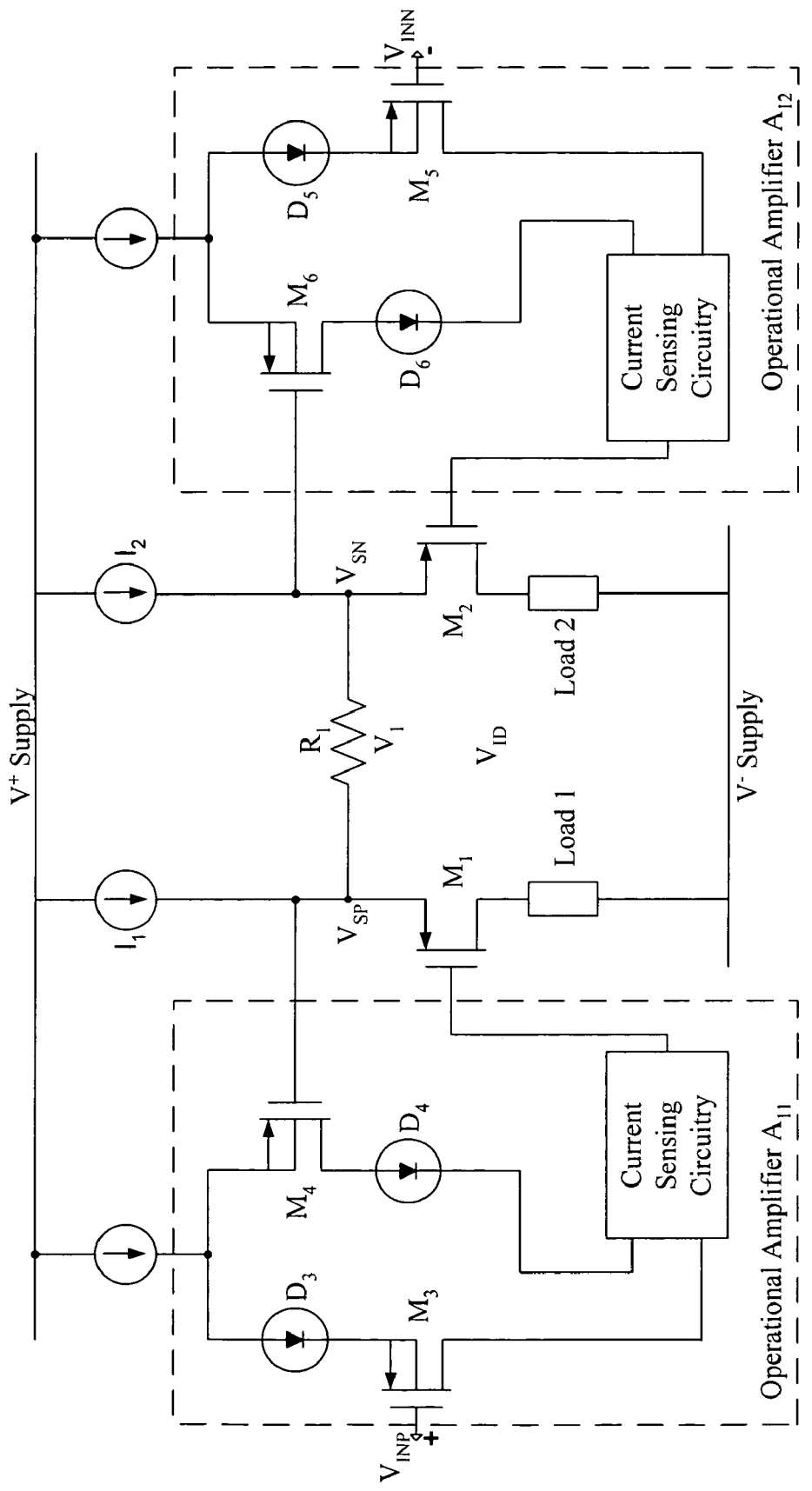
FIG. 2 illustrates a differential input stage of an amplifier circuit, wherein the negative feedback amplifier circuits of the stage utilize the bridge circuit of FIG. 1.
Figure 8:
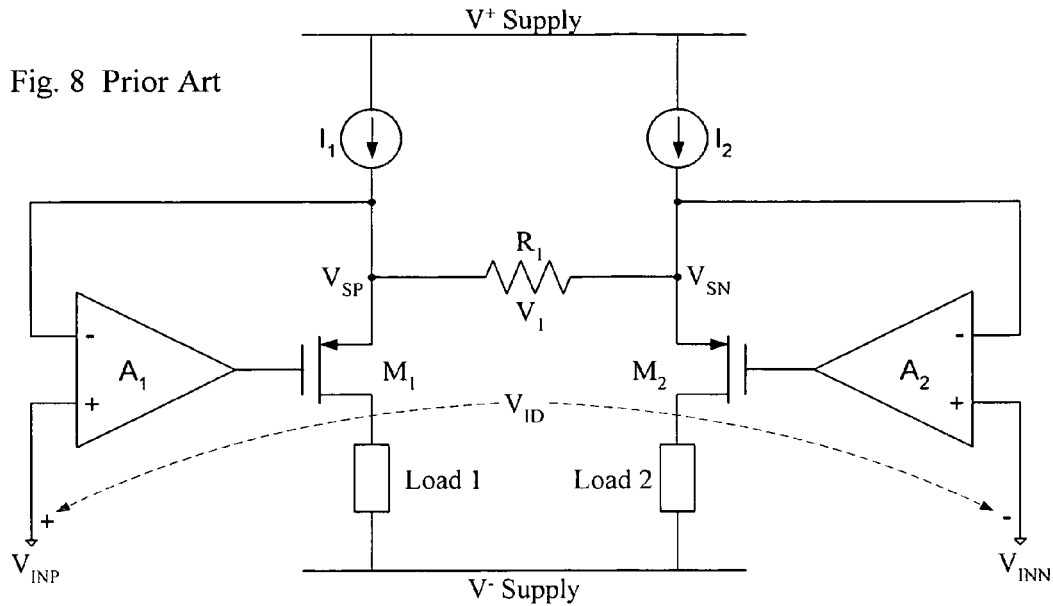
FIG. 8 is a diagram of a prior art differential input stage of an amplifier circuit.

FIG. 2 illustrates an amplifier circuit, utilizing two operational amplifiers $A_{11}$ and $A_{12}$ with bridge type input circuits to provide voltage offsets, as discussed above relative to FIG. 1. The circuit of FIG. 2, however, may be used for an application similar to that of the prior art circuit of FIG. 8.

The operational amplifier $A_{11}$ includes an input bridge that includes matched MOS input transistors $M_3$ and $M_4$ and voltage offset diodes $D_3$ and $D_4$. The drain-source path of each input transistor is stacked with a diode. The diodes are matched, so that when conducting, the voltage across each diode is substantially the same. The two current paths are connected at the top, but the order of the transistor and the diode in each stack is mutually reversed. As in the example of FIG. 1, one of the diodes provides an offset voltage drop in relation to the input signal, whereas the other provides a complimentary voltage drop. The bottoms of the stacks connect to further circuitry of the operational amplifier (current sensing circuitry) for sensing the current difference between the two paths. The output of the current sensing circuitry drives the gate of the MOS transistor $M_1$.

It considering amplifier $A_{11}$ in more detail, a current source connected to the positive voltage rail supplies constant current to the top of the bridge in operational amplifier $A_{11}$. The first diode $D_3$ connects to the source of the first transistor $M_3$ of the matched MOS input transistors $M_3$, $M_4$. When diode $D_3$ is conducting, a constant voltage appears across that diode, which serves as the differential voltage shift or offset for the amplifier $A_{11}$. The drain of the MOS input transistor $M_3$ connects to one input of the current sensing circuitry. The gate of the MOS input transistor $M_3$ serves as the positive (+) input of the illustrated circuit.

On the other side of the input bridge, the source of the other matched MOS input transistor $M_4$ receives current from the constant current supply, that is to say without voltage offset. The drain of the MOS input transistor $M_4$ connects to a second diode $D_4$. When conducting, the second diode $D_4$ provides a constant voltage drop, of substantially the same magnitude as the voltage across the diode $D_3$. The diode $D_4$ connects to the other input of the current sensing circuitry. The gate of the second MOS input transistor $M_4$ serves as the negative (−) input of the operational amplifier $A_{11}$. However, in this application, the negative input is used for feedback and is connected to the $V_{SP}$ node (connection of $R_1$ to source of transistor $M_1$).

The operational amplifier $A_{12}$ includes a similar input bridge. The transistors and diodes of the second bridge are generally similar to those of the first bridge. This bridge includes matched MOS input transistors $M_5$ and $M_6$ and diodes $D_5$ and $D_6$. The drain-source path of each input transistor is stacked with a diode. The diodes are matched, so that when conducting, the voltage across each diode is substantially the same. The two stacks are connected at the top, but the order of the transistor and the diode in each stack is mutually reversed. As in the bridge of amplifier $A_{11}$, one of the diodes provides an offset voltage drop in relation to the respective input signal, whereas the other provides a complimentary voltage drop. The bottoms of the stacks connect to further circuitry of the operational amplifier for sensing the current difference between the two stacks. In the case of the second operational amplifier $A_{12}$, the output of the current sensing circuitry drives the gate of the MOS transistor $M_2$.

Considering now amplifier $A_{12}$ in more detail, a current source connected to the positive voltage rail supplies constant current to the top of the bridge in operational amplifier $A_{12}$. The first diode $D_5$ is connected to the source of the first of the matched MOS input transistors $M_5$. When conducting, a constant voltage appears across the first diode $D_5$, which provides the differential voltage shift or offset for the input to amplifier $A_{12}$. Since diode $D_5$ is similar to diode $D_3$, this input voltage shift in differential amplifier $A_{12}$ will be equal to (i.e., substantially the same as) the input voltage shift in differential amplifier $A_{11}$. The drain of the MOS input transistor $M_5$ is connected to one input of the current sensing circuitry. The gate of the MOS input transistor $M_5$ serves as the negative (−) input of the complete circuit, although it is the positive input of the operational amplifier $A_{12}$.

On the other side of the input bridge of the second operational amplifier $A_{12}$, the source of the other matched MOS input transistor $M_6$ receives current from the constant current supply, that is to say without voltage offset. The drain of the MOS input transistor $M_6$ is connected to a second diode $D_6$. When conducting, the second diode $D_6$ produces a constant voltage drop of substantially the same magnitude as the voltage across the diode $D_5$. Diode $D_6$ is connected to the other input of the current sensing circuitry. The gate of the second MOS input transistor $M_6$ serves as the negative (−) input of the operational amplifier $A_{12}$. However, in this application, that negative input is used for feedback and is connected to the $V_{SN}$ node (connection of $R_1$ to source of transistor $M_2$).

The purpose of the circuit of FIG. 2 is to sense a voltage difference $V_{ID}$ across its inputs ($V_{INP}$ and $V_{INN}$), and to accurately reproduce that voltage across a resistor $R_1$. Then, the resulting current flow in $R_1$ (which is $V_{ID} \div R_1$ by Ohm's Law) can be conveyed, through the metal oxide semiconductor (MOS) transistors $M_1$ and $M_2$, as an accurate signal in the form of a current, for further use in load 1 and or load 2. A typical application, for example, may utilize the illustrated circuit as a transconductance amplifier serving as the input stage of voltage amplifier circuitry. The input stage elements shown in the drawing provide proportional currents to additional circuitry, connected as the loads. In such an application, the further circuitry represented by the loads may provide gain and conversion of the current flows to an amplified voltage output.

The circuit of FIG. 2 operates as follows. First consider an idle or equilibrium state where the input voltage difference $V_{ID}=0$. The two input voltages $V_{INP}$ and $V_{INN}$ are accordingly identical. Each of the two operational amplifiers $A_{11}$, $A_{12}$ forms a local negative feedback loop around a transistor $M_1$ or $M_2$, respectively. As long as the operational amplifiers have high DC gain, and all components are functioning normally, the negative feedback loops force the nodes $V_{SP}$, $V_{SN}$ to values essentially equal to the input voltages of the amplifiers A11 and A12, that is to say $V_{INP}$ Plus the offset or shift voltage and $V_{INN}$ plus the offset or shift voltage, respectively. Where the input voltage difference $V_{ID}=0$, the voltage shifts cancel out, and the voltage $V_1$ (across $R_1$) remains 0.

However, the input shifts provided by the offset voltages (across $D_3$ and $D_5$) extend the input range of the circuit of FIG. 2 nearer the negative supply voltage. The voltage $V_1$ across $R_1$ still tracks the differences between the input signals $V_{INP}$ and $V_{INN}$, because the feedback loops force the voltages on opposite ends of the resistor $R_1$ to values corresponding to voltages at the op-amp inputs, and the resulting currents follow the signal differences. When the input voltages $V_{INP}$ and $V_{INN}$ differ in value by a nonzero value $V_{ID}$, the local feedback loops will continue, separately, to adjust to maintain each operational amplifier's inputs at the same potential. Consequently voltage $V_1$ across $R_1$ will tend to equal $V_{ID}$, if all components function as intended, although $V_{SP}$ and $V_{SN}$ will both be shifted by an amount corresponding to the offset voltage $V_{SHIFT}$ provided by diodes $D_3$, $D_5$. The two constant current sources $I_1$ and $I_2$ (with identical values) deliver fixed currents, and the operational amplifiers have high input resistances (assume infinite, for ease of explanation). Therefore any current that flows in $R_1$ must flow also through the transistors $M_1$, $M_2$ and appear as a difference in the drain currents of those transistors. This current will flow to subsequent circuitry (drawn abstractly as "loads") connected to the drains of the transistors $M_1$, $M_2$.

As noted, the individual voltages $V_{SP}$ and $V_{SN}$ now include the offset. The offset can be chosen to provide necessary operational ranges across the respective transistors $M_1$ and $M_2$, even when the input signals approach the negative supply voltage. When the input voltages $V_{INP}$ and $V_{INN}$ approach the negative power-supply voltage V⁻, the negative feedback loops around $A_1$ and $A_2$ tend to force $V_{SP}$, $V_{SN}$ toward a value offset from the negative supply voltage by the offset voltage (that is to say the voltage across diodes $D_3$ and $D_5$). Assuming the offset is high enough, the voltages across the transistors $M_1$ and $M_2$ will be sufficient to maintain normal operation.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A differential amplifier for providing an output signal proportional to a difference between first and second input signals, comprising:
   differential current sensing circuitry; and
   an input bridge coupled to the differential current sensing circuitry for receiving the first and second input signals, the input bridge being configured to provide a differential voltage offset and a complimentary voltage drop of equal magnitude in first and second current paths of the input bridge, respectively, that are responsive to the first and second input signals, each current path supplying a current proportional to a respective one of the input signals to the differential current sensing circuitry.

2. The amplifier of claim 1, wherein:
   the first current path of the input bridge comprises a first input transistor for receiving the first input signal, and a first circuit element coupled to the first input transistor so as to provide the differential voltage offset; and the second current path of the input bridge comprises a second input transistor, matching the first input transistor, for receiving the second input signal, and a second circuit element coupled to the second input transistor so as to provide the complimentary voltage drop of magnitude equal to the differential voltage offset.

3. The amplifier of claim 2, wherein the first and second circuit elements comprise matching elements from the group consisting of: matching diodes, matching diode connected transistors and matching resistors.

4. The amplifier of claim 2, wherein each of the first and second input transistors comprises a metal oxide semiconductor (MOS) transistor.

5. The amplifier of claim 4, wherein each of the MOS transistors has an isolated well or back-gate connection tied to its source.

6. An amplifier circuit, comprising:
a differential amplifier for receiving an input signal and a feedback signal on its inputs; and
a transistor coupled to an output of the differential amplifier for producing a flow of current proportional to the output of the differential amplifier, the feedback signal being related to the flow of current produced by the transistor,
wherein the differential amplifier comprises:
(a) differential current sensing circuitry; and
(b) an input bridge coupled to the differential current sensing circuitry for receiving the input signal and feedback signal, and in response, providing a differential voltage offset and a complimentary voltage drop of equal magnitude in first and second current paths of the input bridge, respectively, each current path supplying a current proportional to a respective one of the input and feedback signals to the differential current sensing circuitry.

7. The circuit of claim 6, wherein:
the first current path of the input bridge comprises a first input transistor for receiving the input signal, and a first circuit element coupled to the first input transistor so as to provide the differential voltage offset; and
the second current path of the input bridge comprises a second input transistor, matching the first input transistor, for receiving the feedback signal, and a second circuit element coupled to the second input transistor so as to provide the complimentary voltage drop of magnitude equal to the differential voltage offset.

8. The circuit of claim 7, wherein the first and second circuit elements comprise matching elements from the group consisting of: matching diodes, matching diode connected transistors and matching resistors.

9. The circuit of claim 7, wherein each of the first and second input transistors comprises a metal oxide semiconductor (MOS) transistor.

10. The circuit of claim 9, wherein each of the MOS transistors has an isolated well or back-gate connection tied to its source.

11. An input stage of a voltage-to-voltage amplifier, comprising a pair of circuits as recited in claim 6.

12. An improvement in an amplifier for providing an output proportional to difference between first and second input signals, wherein the improvement comprises:
first and second matched input transistors for receiving the first and second input signals, respectively; and
first and second matched circuit elements each providing voltage drop of a predetermined magnitude, wherein:
the first circuit element is coupled to the first input transistor so as to provide current from a power supply to the first input transistor and provide a differential offset voltage of the predetermined magnitude, and the first input transistor is coupled to supply a current proportional to the first input signal to further circuitry of the amplifier; and
the second input transistor is coupled to the power supply, and the second circuit element is coupled to an output of the second input transistor so as to provide current proportional to the second input signal to the further circuitry of the amplifier and provide a voltage drop matching the differential offset voltage.

13. The improvement in an amplifier as in claim 12, wherein:
the first input transistor and the first circuit element are arranged to form a first side of a bridge circuit coupled to the further circuitry of the amplifier; and
the second input transistor and the second circuit element are arranged to form a second side of the bridge circuit coupled to the further circuitry of the amplifier.

14. The improvement in an amplifier as in claim 12, wherein each of the first and second matched circuit elements comprises an element from the group consisting of: a diode, a diode connected transistor and a resistor.

15. The improvement in an amplifier as in claim 12, wherein the first and second input transistors comprise matched metal oxide semiconductor (MOS) transistors.

16. The improvement of claim 15, wherein each of the MOS transistors has an isolated well or back-gate connection tied to its source.

17. A method of processing first and second input signals, comprising:
producing a first current flow in a first path, proportional to the first input signal;
producing a second current flow in a second path, proportional to the second input signal;
providing a differential voltage offset in the first path;
providing a complimentary voltage drop in the second path, of a magnitude equal to magnitude of the differential voltage offset in the first path; and
sensing a difference between the first and second currents.

* * * * *